US008446201B2

(12) United States Patent
Khoury et al.

(10) Patent No.: US 8,446,201 B2
(45) Date of Patent: May 21, 2013

(54) HIGH SPEED RAIL TO RAIL PHASE SPLITTER FOR PROVIDING A SYMMETRICAL DIFFERENTIAL OUTPUT SIGNAL HAVING LOW SKEW

(75) Inventors: Elie G. Khoury, Gilbert, AZ (US); DC Sessions, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 1307 days.

(21) Appl. No.: 11/578,890

(22) PCT Filed: Apr. 19, 2005

(86) PCT No.: PCT/IB2005/051279
§ 371 (c)(1),
(2), (4) Date: Nov. 18, 2009

(87) PCT Pub. No.: WO2005/104357
PCT Pub. Date: Nov. 3, 2005

(65) Prior Publication Data
US 2011/0050341 A1     Mar. 3, 2011

Related U.S. Application Data

(60) Provisional application No. 60/563,454, filed on Apr. 20, 2004.

(51) Int. Cl.
*H03K 5/13* (2006.01)
(52) U.S. Cl.
USPC .......................................... 327/259
(58) Field of Classification Search
USPC ........................................ 327/257
See application file for complete search history.

(56) References Cited

U.S. PATENT DOCUMENTS

| 4,015,214 | A  |   | 3/1977  | Yokoyama et al. |        |
|-----------|----|---|---------|-----------------|--------|
| 4,885,550 | A  |   | 12/1989 | Ferrer          |        |
| 5,039,891 | A  |   | 8/1991  | Wen et al.      |        |
| 5,225,791 | A  |   | 7/1993  | Ohta et al.     |        |
| 6,507,224 | B1 | * | 1/2003  | Lee et al.      | 327/91 |
| 6,686,772 | B2 |   | 2/2004  | Li et al.       |        |
| 2002/0118043 | A1 |   | 8/2002 | Enam           |        |
| 2003/0094977 | A1 |   | 5/2003 | Li et al.      |        |

FOREIGN PATENT DOCUMENTS

| DE | 19614996 A1 | 10/1997 |
|----|-------------|---------|
| EP | 1 248 371   | 10/2002 |

OTHER PUBLICATIONS

Peeters, E et al. "A fully differential 1.5V low-power CMOS operational amplifier with a rail-to-rail current-regulated constant gm input stage," IEEE 1997 Custom Integrated Circuits Conf., pp. 75-78 (1997).
Cataldo G et al.: "A CMOS CCII +" 1995 IEEE International Symposium on Circuits and Systems; Seattle Apr. 30-May 3, 1995; N.Y. IEEE US vol. 1 pp. 315-318.
International Search Report mailed Jul. 25, 2005 in corresponding PCT/IB2005/051279.
International Preliminary Report on Patentability and Written Opinion in corresponding PCT/IB2005/051279.

* cited by examiner

*Primary Examiner* — Daniel Rojas

(57) ABSTRACT

A novel high-speed phase splitter circuit (100) and method of operation are disclosed. This high-speed phase splitter (100) creates a differential rail-to-rail output signal from a single ended input signal, with an inherent low skew and symmetrical output. The circuit (100) uses a phase splitting input stage (110, 130) followed by several amplification stages (150, 170) that are symmetrical and balanced in nature.

29 Claims, 4 Drawing Sheets

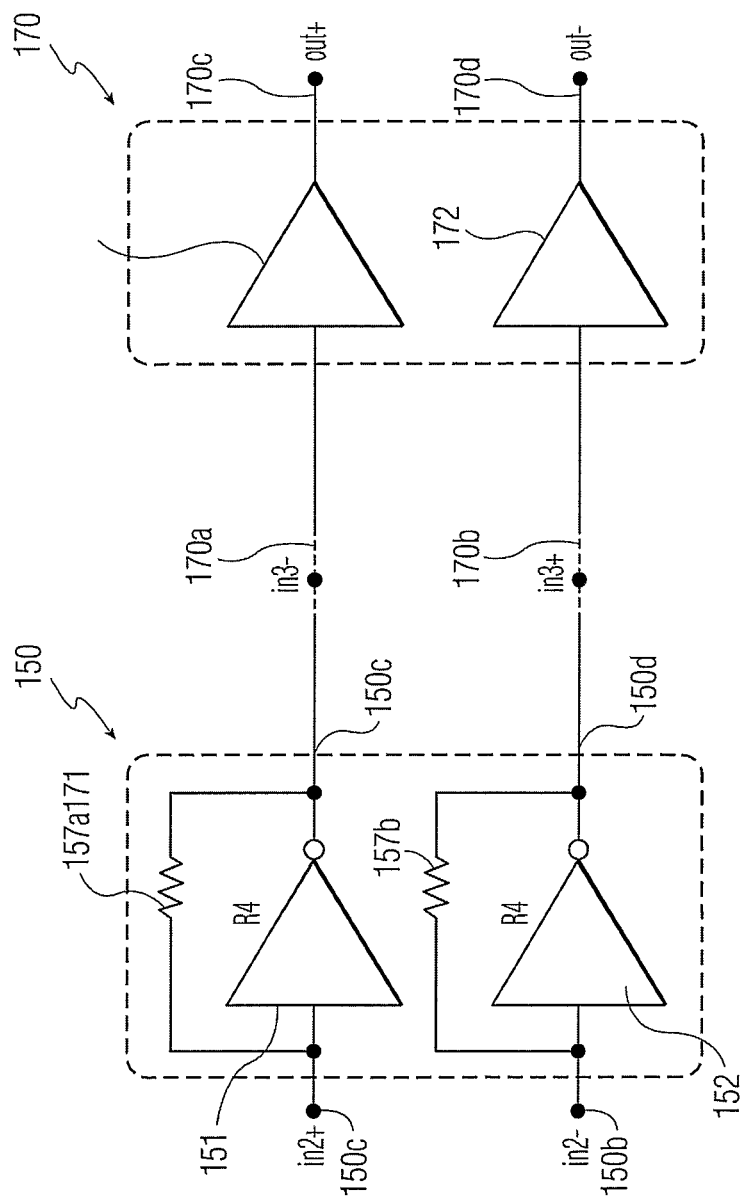

HIGH SPEED RAIL TO RAIL PHASE SPLITTER FOR PROVIDING A SYMMETRICAL DIFFERENTIAL OUTPUT SIGNAL HAVING LOW SKEW

CROSS REFERENCE TO RELATED APPLICATION

This application claims the benefit of U.S. provisional application Ser. No. 60/563,454 filed Apr. 20, 2004, which is incorporated herein whole by reference.

The invention relates to the field of phase splitters and more specifically to the field of phase splitters that provide differential output signals having low skew and symmetry.

In many signal-processing applications, such as in RF signal processing applications, it is desirable to transform a single ended input signal into a differential signal. However, it is important to reduce phase error between each of the output signals making up the differential signal. In some signal processing applications, phase error in the differential output signal leads to intermodulation distortion.

Conventional techniques that are used to transform the single ended signal into the differential signal typically employ two parallel chains of inverter circuits each having different times delay elements in order to provide the differential signal. A different approach that does not utilize inverter circuitry is disclosed in U.S. Pat. No. 4,885,550, which provides a single input port to differential output amplifier circuit. United States Patent Publication No. 2002/0118043 also provides a single to differential input buffer circuit. Unfortunately, both circuits have design complexity that reduces their effectiveness in providing a differential output signal that has low signal skew and symmetry.

A need therefore exists to provide a phase splitter circuit that receives a single ended input signal and provides a differential output signal having low signal skew and symmetry. It is therefore an object of the invention to provide such a circuit.

In accordance with the invention there is provided a rail-to-rail phase splitter circuit comprising: a first supply voltage port as a first rail for receiving of a first potential; a second supply voltage port as a second rail for receiving of a second potential that is lower than the first potential; a phase splitter comprising a first branch and a second branch disposed between the first and second supply voltage ports, first through fourth output ports and a first input port for receiving of a first input signal having rail to rail voltage transitions about a known voltage level; a complementary differential amplifier for splitting the input signal into two complementary differential output signals, the complementary differential amplifier comprising first and second output ports and first through fourth input ports electrically coupled with the first through fourth output ports of the phase splitter; and, a transimpedance amplifier comprising first and second input ports electrically coupled with the complementary differential amplifier and first and second output ports for providing complementary output signals therefrom that transition from rail to rail between the first and second potentials, wherein the phase splitter, the complementary differential amplifier and the transimpedance amplifier are disposed between the first supply voltage port and second supply voltage port for receiving of the first and second potentials.

In accordance with the invention there is provided a method of providing a differential output signal comprising: receiving of an input signal having rail to rail voltage transitions about a known voltage level from a second voltage level to a first voltage level; phase splitting the input signal into two complementary differential output signals that are spaced one from the other in potential and do not overlap; level shifting the two complementary differential output signals to form two level shifted complementary output signals that are other than rail to rail; and, amplifying the two level shifted complementary output signals so they have low skew and transition from rail to rail between the first and second voltage levels.

In accordance with the invention there is provided a circuit comprising: means for receiving of an input signal having rail to rail voltage transitions about a known voltage level from a second voltage level to a first voltage level; means for phase splitting the input signal into two complementary differential output signals that are spaced one from the other in potential and do not overlap; means for level shifting the two complementary differential output signals to form two level shifted complementary output signals that are other than rail to rail; and, means for amplifying the two level shifted complementary output signals so they have low skew and transition from rail to rail between the first and second voltage levels.

In accordance with the invention there is provided a storage medium for storing of instruction data comprising: first instruction data for receiving of an input signal having rail to rail voltage transitions about a known voltage level from a second voltage level to a first voltage level; second instruction data for phase splitting the input signal into two complementary differential output signals that are spaced one from the other in potential and do not overlap; third instruction data for level shifting the two complementary differential output signals to form two level shifted complementary output signals that are other than rail to rail; and, fourth instruction data for amplifying the two level shifted complementary output signals so they have low skew and transition from rail to rail between the first and second voltage levels.

Exemplary embodiments of the invention will now be described in conjunction with the following drawings, in which:

FIG. 1c illustrates the transimpedance amplifier stage of the rail-to-rail phase splitter circuit;

FIG. 1d illustrates the fourth stage a buffer stage, which is a rail-to-rail output driver, for the rail-to-rail phase splitter circuit;

Figure 2A:
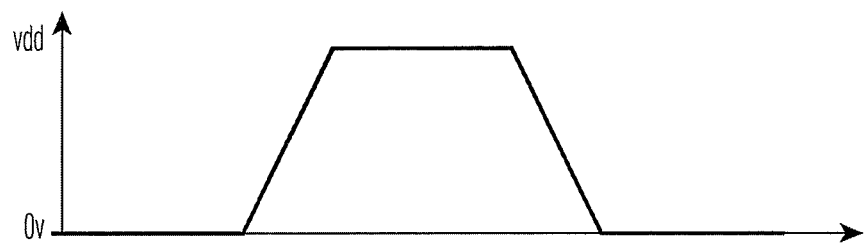
FIG. 2a illustrates a single ended input signal that rises from a first voltage level to a second voltage level during a predetermined period of time, this signal is for being provided to an input port of the rail-to-rail output driver.
Figure 2B:
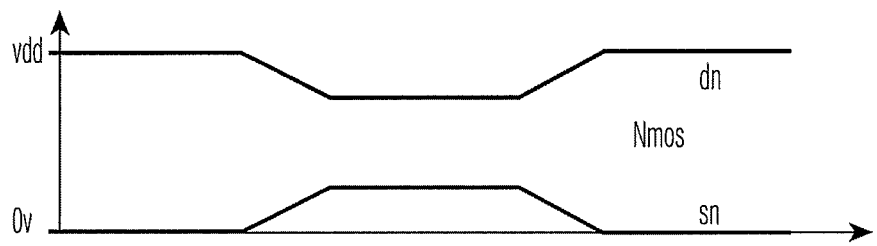
Figure 2C:
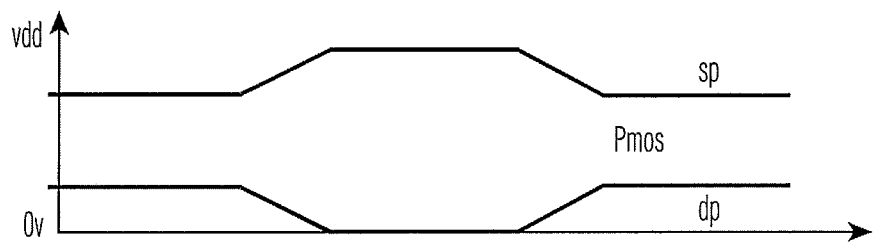
Figure 2D:
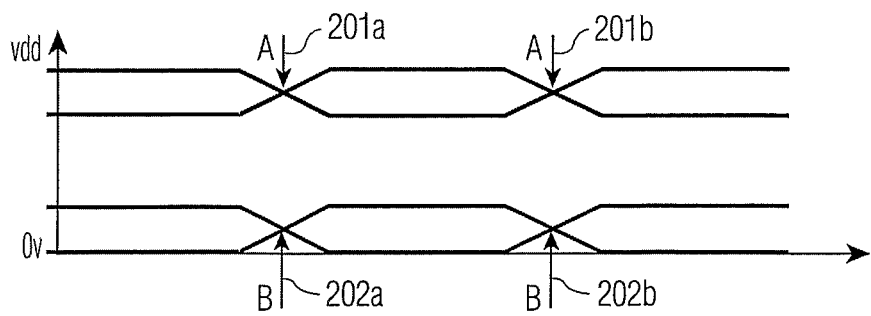
Figure 3A:
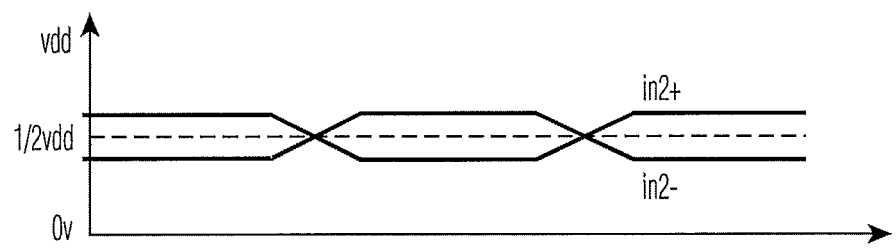
Figure 3B:
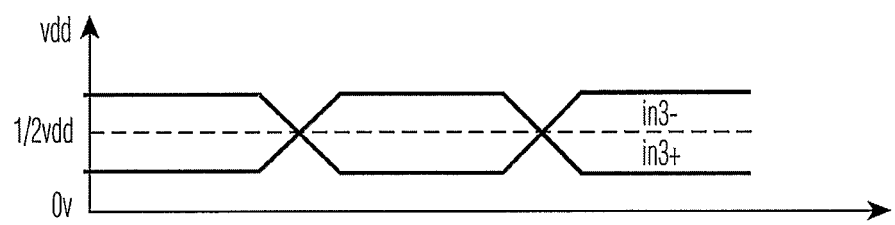
Figure 3C:
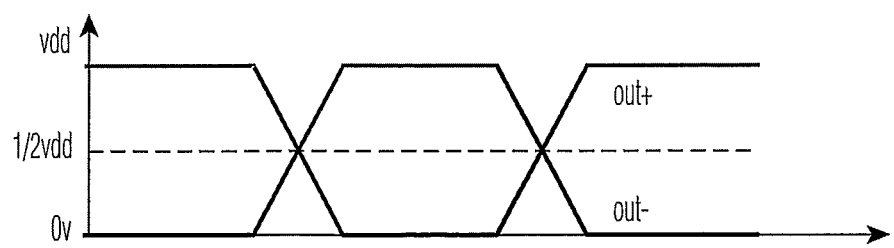

FIGS. 2b and 2c graphically illustrate the relationship between potentials on the drain and source terminals of the NMOS1 device and PMOS1 devices;

FIG. 2d illustrates a shift in cross over voltages for both the NMOS1 device and PMOS1 devices;

FIG. 3a illustrates output signals "in2+" and "in2−" provided from output ports of the complementary differential amplifier stage;

FIG. 3b illustrates output signals "in3−" and "in3+" provided from the output ports of the transimpedance amplifier stage; and, FIG. 3c illustrates output signals "out+" and "out−" provided from the output ports of the buffer stage.

Figure 1A:
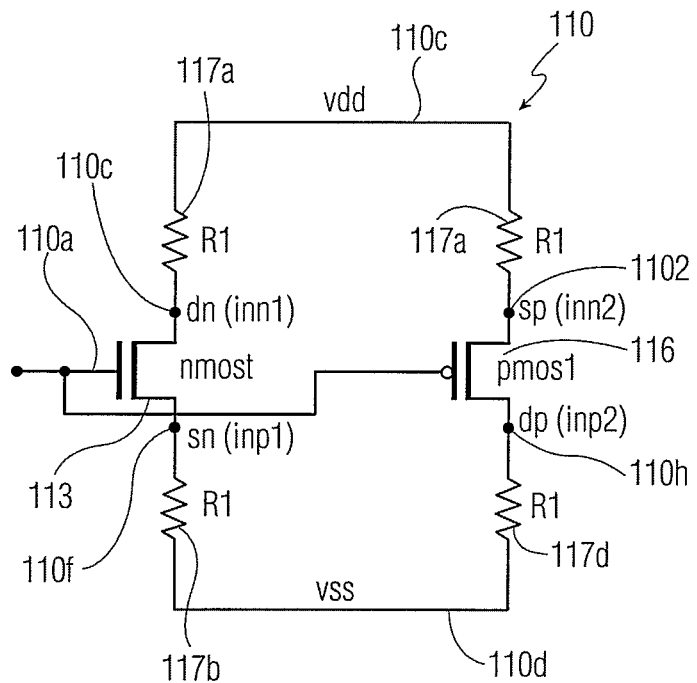
FIG. 1a illustrates a phase splitter stage of a rail-to-rail phase splitter circuit.
Figure 1B:
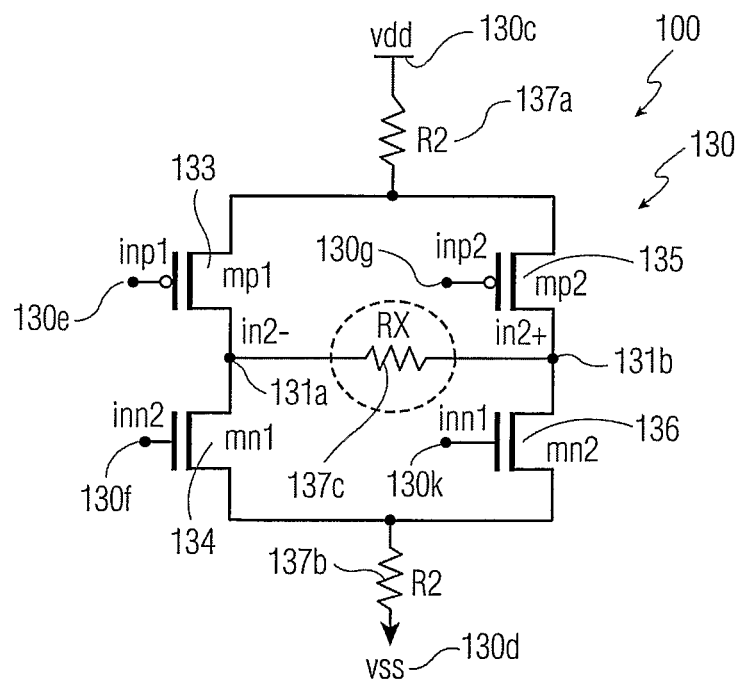
FIG. 1b illustrates a complementary differential amplifier stage of the rail-to-rail phase splitter circuit.

FIGS. 1a through 1d illustrate multiple stages of a rail-to-rail phase splitter circuit 100 in accordance with a preferred embodiment of the invention. The phase splitter circuit 100 is comprised of four stages of symmetrical circuits disposed in series. FIG. 1a illustrates a phase splitter stage 110, which is the first stage. FIG. 1b illustrates a complementary differential amplifier stage 130, which is the second stage. FIG. 1c illustrates the third stage, a transimpedance amplifier stage 150. FIG. 1d illustrates the fourth stage, a buffer stage 170, which is a rail-to-rail output driver stage.

Referring to FIG. 1a, the first stage 110 is comprised of a first n channel metal oxide semiconductor (NMOS) transistor (NMOS1) 113 and a first p channel metal oxide semiconductor (PMOS) transistor (PMOS1) 114. Four resistive loads, labeled R1, 117a through 117d, electrically couple the drain and source terminals of devices NMOS1 113 and PMOS1 116 to a first and second supply voltage ports, 110c and 110d, connected for receiving of supply voltage potentials, Vdd and Vss, respectively. Gate terminals of NMOS1 113 and PMOS1 116 are connected together to a single input port 110a. This first stage 110 has four output ports, 110a through 110d. Output ports 110e and 110f are formed at respective drain and source terminals of the NMOS1 device 113 and output ports 110g and 110h are formed at respective drain and source terminals of the PMOS1 device 116.

Referring to FIG. 2a, a single ended input signal that is provided to the input port 110a of the phase splitter circuit 100 is shown. The signal oscillates rail to rail from a first voltage level to a second voltage level with a known frequency. For the NMOS1 device 113, for a rising transition of the rising input signal provided to the input port 110a, the NMOS1 device 113 conducts current when its gate voltage reaches the threshold voltage (Vth). Once this gate voltage is reached, current flows through resistors 117a and 117b. Prior to this current flow from the drain to source terminals of the NMOS1 device 113, the drain and source terminals are at first and second potentials that corresponds to potentials Vdd and Vss, respectively. During the input signal the drain terminal voltage, dn potential, exhibits a voltage drop of V=I*R1 from the potential of Vdd, while the source terminal voltage, sn potential, rises from the potential of Vss to a value of V=I*R1, as shown in FIG. 2b.

For a rising or falling input signal provided to the input port 110a, two complimentary differential output signals are provided from output ports 110e through 110f. Both of these complimentary differential output signals are of equal magnitude, but at different potentials (FIG. 2d). Therefore, the phase of the input signal is split. For obtaining a complementary output signal from the NMOS1 device 113, a PMOS1 device 116 is utilized. The PMOS1 device 116 and corresponding resistors 117c and 117d behave opposite to that of the NMOS1 device 113.

Referring to FIGS. 2b and 2c, when the potential on the drain terminal of NMOS1 device 113 is rising, represented by the dn potential, the potential on the source terminal, represented by the sp potential, of the PMOS1 device 116 is falling and when the potential on the source terminal, represented by the sn potential, of NMOS1 device 113 is falling, the potential on the drain terminal, the dp potential, of the PMOS1 device 116 is rising.

Preferably, during manufacturing of the PMOS1 and NMOS1 devices, the device widths are of such a ratio to attain equal transconductance "gm", or equal current flow, and to have approximately the same active area, where a width and length product of the active area for the NMOS1 device is approximately equal to a width and length product of the active area for the PMOS1 device (Wn*Ln=Wp*Lp). As a result of the same active area for both devices, equal current flows through devices, 113 and 116. Thus, two complimentary differential and phase split output signals are provided from the output ports 110e through 110g.

Referring to FIG. 2d, since the NMOS1 113 and PMOS1 116 devices are "turned on", when their respective threshold voltages, Vtn, Vtp, are reached, this creates a shift in the crossover voltage, depicted as points labeled "A", 210a and 201b and "B", 202a and 202b. These crossover voltages shift toward Vdd and Vss, respectively, for the NMOS1 113 and PMOS1 116 devices. Furthermore, the shifts in the crossover voltages occur at the same time because of equal gain, gm, for each of the NMOS1 113 and PMOS1 116 devices as well as approximately the same size active areas. Because this crossover occurs at the same time in both devices 113 and 116, the skew, which is the time difference in time between the dn, sp and sn, dp signals over all phases of the first stage splitter 110 is small, in the order of a few ps.

Referring back to FIG. 1b, the a complementary differential stage 130 is shown with two NMOS devices, labeled MN1 134 and MN2 136, and two PMOS devices, labeled MP1 133 and MP2 135. Drain terminals of devices MP1 133 and MP2 135 are electrically coupled together and are further electrically coupled to a first supply voltage port 130c, for receiving of potential Vdd, through resistor R2 137a. Source terminals of devices MN1 134 and MN2 136 are electrically coupled together and are further electrically coupled to a second supply voltage port 130d, for receiving of potential Vss, through resistor R2 137b. A third resistor Rx 137c, which is a virtual resistor, is disposed between a first output port 131a formed between the source terminal of device MP1 133 and the drain terminal of device MN1 134 and second output port 131b formed between the source terminal of device MP2 135 and the drain terminal of device MN2 136.

Devices MP1 133, MP2 132 and R2 137a constitute a PMOS differential stage while devices MN1 134, MN2 136 and R2 137b constitute the NMOS differential stage. The resistors R2, 137a and 137b, are used instead of a current source because no specific current is needed and two n-type and p-type current sources would not provide a close enough match, but two adjacent resistors, such as R2, 137a and 137b, are manufacturable to have very similar resistances due to the manufacturing process and thus provide for approximately matched current propagation.

Gate terminals of the PMOS devices, MP1 133 and MP2 135, form input ports 130e and 130f to the second stage 130 and electrically coupled with output ports 110f and 110h of the first stage 110, respectively. Gate terminals of the NMOS devices, MN1 134 and MN2 136, are electrically coupled to the output ports, 110e and 110g, of the first stage 110.

The objective of the complementary differential stage 130 is to level shift and recombine the two complementary differential output signals received from the first stage 110, which are optionally on different potential or voltage planes, into one low swing differential output signal centered about Vdd/2.

Referring to FIG. 3a, when the signal at port 110f, "inp1", is high, at approximately the potential of Vdd and the signal at port 110e "inn1", is low, at approximately the potential of Vss, most of the current flows through resistor R2 137a, device MP1 133 and the virtual load RX 137c, through to device MN2 136 and out through resistor R2 137b to the second supply voltage port 130d. When this occurs, devices MP2 133 and MN1 134 are not "turned off" hard, but are slightly conducting current since their gate potentials are not at the potential of Vss or Vdd, respectively, but they are at I*R1 and Vdd−I*R1, respectively, which is close the source terminal voltage, Vss.

Because of the symmetry of the second stage 130, the induced voltage that results from current propagating through Rx 137c, is V(Rx)=I2*Rx, where I2 is the current flowing from nodes 131a to 131b. By design, this voltage is centered at approximately Vdd/2 with equal rise and fall times. When the first stage 110 output signal transitions, the current flowing through Rx 137c is reversed, now propagating from node 131b to 131a, and the induced voltage across Rx 137c is equal to −V(Rx).

Referring back to FIGS. 1b and 1c, resistor Rx 137s is not an actual resistor but a virtual load formed from input ports 150a and 150b of the third stage 150. Thus, the current that propagates through resistor Rx 137s actually propagates into the input ports 150a and 150b of the third stage 150. Thus, the output voltages, "in2+" and "in2−" that are provided to the third stage input ports 150a and 150b, respectively, are differential, centered around Vdd/2 and symmetrical thereabout, with equal rise and fall times.

The third stage 150 shown in FIG. 1c is a transimpedance stage, which utilizes two inverters with feedback load resistors. Disposed between the first input port 150a and a first output port 150c is a first inverter 151 with a feedback resistor R4 157a disposed in parallel therewith. Disposed between the second input port 150b and a second output port 150d is a second inverter 152 with a feedback resistor R4 157b disposed in parallel therewith. Each resistor R3, 157a and 157b, provides a negative feedback to the input port of its respective inverter, 151 and 152. This resistor R4, 157a and 157b, lowers the high gain of an inverter stage from few hundred, or thousands, to a small number such as five. The net effect of this stage 150 is that it creates a known output waveform having equal rise and fall times, given that the input signals provided to this stage are within predetermined limits. This third stage 150 acts as a resistive load since its input signal is current based and not voltage based. Referring to FIG. 3b, the output signals, "in3−" and "in3+" that are provided from the output ports, 150c and 150d, of this stage 150 are not rail-to-rail since a crowbar, or through current, is involved. By coupling a portion of the transimpedance stage 150 to each of the output ports of the second stage, 131a and 131b, a virtual resistance is created between the output ports 131a and 131b and output signals from the second stage 130 are approximately equalized.

Because the output signals, "in3−" and "in3+", provided from the output ports 150c and 150d, are controlled by the design of the transimpedance stage 150, these signals are symmetrical differential signals with very low skew and are centered around Vdd/2, but are not rail to rail.

Referring back to FIG. 1d, the fourth stage 170 is provided with input ports 170a and 170b that are electrically coupled, respectively, with the output ports 150c and 150d of the third stage 150. The final stage 170 receives the "in3−" and "in3+" output signals and buffer them. Referring to FIG. 3c, the resulting output signals "out+" and "out−" are rail to rail. The fourth stage 170 it is designed to amplify, or buffer, the 3rd stage output signals "in3−" and "in3+" and to preserve the low skew and rise and fall symmetry of these signals.

Preferably the rail-to-rail phase splitter circuit 100 is used in digital circuits where high speed, or optionally low speed, low skew and high signal symmetry is required. Optionally, the rail-to-rail phase splitter circuit 100 is utilized in the high-speed differential input output pad design.

Conventional techniques for phase splitting are utilized for low speed signals, such as those having transitions in the order of a few hundred MHz, where skew in the order of 200 ps to 400 ps is observed. Whereas, in high speed signaling, with signals having transitions in the order of Gb/s, a skew of less than 50 ps skew between the differential signals is preferable. Advantageously, the embodiment of the invention operates for signals having transitions in the order of Gb/s, where conventional prior art technique fail.

Numerous other embodiments may be envisaged without departing from the spirit or scope of the invention.

What is claimed is:

1. A rail-to-rail phase splitter circuit comprising:
a first supply voltage port as a first rail configured to receive a first potential; and
a second supply voltage port as a second rail configured to receive a second potential that is lower than the received first potential;
a phase splitter comprising a first branch and a second branch disposed between the first supply voltage port and the second supply voltage port, first through fourth phase splitter output ports, and a phase splitter input port configured to receive a first input signal having rail to rail voltage transitions about a known voltage level;
a complementary differential amplifier configured to split the input signal into two complementary differential output signals, the complementary differential amplifier comprising a first differential amplifier output port, a second differential amplifier output port, and first through fourth differential amplifier input ports electrically coupled with the first through fourth phase splitter output ports; and
a transimpedance amplifier comprising a first transimpedance amplifier input port and a second transimpedance amplifier input port electrically coupled with the complementary differential amplifier, and a first transimpedance amplifier output port and a second transimpedance amplifier output port configured to provide complementary output signals therefrom that transition from rail to rail between the first and second potentials, wherein the phase splitter, the complementary differential amplifier, and the transimpedance amplifier are disposed between the first supply voltage port and second supply voltage port and configured to receive the first and second potentials.

2. The rail-to-rail phase splitter circuit according to claim 1, further comprising:
a buffer circuit comprising a first buffer input port and a second buffer input port electrically coupled with the first transimpedance amplifier output port and the second transimpedance amplifier output port, wherein the first transimpedance amplifier output port and the second transimpedance amplifier output port are configured to provide the complementary output signals.

3. The rail-to-rail phase splitter circuit according to claim 1, wherein the first branch comprises a first NMOS device having gate, drain, and source terminals.

4. The rail-to-rail phase splitter circuit according to claim 3, wherein the second branch comprises a first PMOS device having a gate terminal electrically coupled with a gate terminal of the first NMOS device and configured to form the phase splitter input port.

5. The rail-to-rail phase splitter circuit according to claim 4, wherein the first NMOS device and the first PMOS device comprise approximately equal active areas and approximately equal gains.

6. The rail-to-rail phase splitter circuit according to claim 4, wherein the first branch comprises a first set of two approximately identical resistors respectively disposed between the drain terminal of the first NMOS device and the first supply voltage port and between the source terminal of the first NMOS device and the second supply voltage port, wherein the first differential amplifier output port and the second differential amplifier output port are formed respectively at the drain and source terminals of the first NMOS device.

7. The rail-to-rail phase splitter circuit according to claim 6, wherein the second branch comprises a second set of two approximately identical resistors respectively disposed between the drain terminal of the first PMOS device and the first supply voltage port and between the source terminal of the first PMOS device and the second supply voltage port, wherein the second phase splitter output port and the third phase splitter output port are formed respectively at the drain and source terminals of the first PMOS device.

8. The rail-to-rail phase splitter circuit according to claim 1, wherein the complementary differential amplifier comprises:
a first branch;
a second branch;
a first resistive coupling between a first end of both branches to the first supply voltage port; and
a second resistive coupling between a second end of both branches to the second supply voltage port, wherein resistance values for the first resistive coupling and the second resistive coupling are approximately equal.

9. The rail-to-rail phase splitter circuit according to claim 8, wherein the first branch of the complementary differential amplifier comprises:
a first PMOS device having a gate terminal electrically coupled with the first differential amplifier input port and a drain terminal electrically coupled to the first end of the first branch and a source terminal; and,
a first NMOS device having a gate terminal electrically coupled with the second differential amplifier input port, a drain terminal electrically coupled to the source terminal of the first PMOS device for forming the first differential amplifier output port and the source terminal thereof electrically coupled to the second end of the first branch.

10. The rail-to-rail phase splitter circuit according to claim 9, wherein the second branch of the complementary differential amplifier comprises:
a second PMOS device having a gate terminal electrically coupled with the third differential amplifier input port, a drain terminal electrically coupled to the first end of the second branch, and a source terminal; and,
a second NMOS device having a gate terminal electrically coupled with the fourth differential amplifier input port, a drain terminal electrically coupled to the source terminal of the second PMOS device for forming the second differential amplifier output port of, and the source terminal thereof electrically coupled to the second end of the second branch.

11. The rail-to-rail phase splitter circuit according to claim 10, wherein the second NMOS device and the second PMOS device comprise approximately equal active areas and approximately equal gains.

12. The rail-to-rail phase splitter circuit according to claim 1, wherein the phase splitter comprises a PMOS differential stage and, a NMOS differential stage electrically coupled with the PMOS differential stage.

13. The rail-to-rail phase splitter circuit according to claim 1, comprising a virtual resistor disposed between the first and second differential amplifier output ports.

14. The rail-to-rail phase splitter circuit according to claim 1, wherein the transimpedance amplifier comprises:
a first inverter disposed between the first transimpedance amplifier input port and the first transimpedance amplifier output port; and
a fourth resistor disposed in parallel with the first inverter.

15. The rail-to-rail phase splitter circuit according to claim 14, wherein the transimpedance amplifier comprises:
a second inverter disposed between the second transimpedance amplifier input port and the second transimpedance amplifier output port; and
a fifth resistor disposed in parallel with the second inverter.

16. The rail-to-rail phase splitter circuit according to claim 2, wherein the buffer circuit comprises:
a first buffer circuit disposed between the first buffer circuit input port and the first buffer circuit output port.

17. The rail-to-rail phase splitter circuit according to claim 16, wherein the buffer circuit comprises:
a second buffer circuit disposed between the second buffer circuit input port and the second buffer circuit output port, wherein the first buffer circuit and the second buffer circuit are configured to provide the complementary output signals therefrom.

18. The rail-to-rail phase splitter circuit according to claim 1, wherein the known voltage level is at a potential of approximately halfway between the first and second potentials.

19. A method of providing a differential output signal comprising:
receiving an input signal having rail to rail voltage transitions about a known voltage level from a second voltage level to a first voltage level;
phase splitting the received input signal into two complementary differential output signals that are spaced one from the other in potential and do not overlap;
level shifting the two complementary differential output signals to form two level shifted complementary output signals that are other than rail to rail; and,
amplifying the two level shifted complementary output signals.

20. The method according to claim 19, wherein a crossover point between these two complementary differential output signals is at a potential of approximately halfway between the first and second voltage levels.

21. The method according to claim 20, wherein the two complementary differential output signals are symmetrical about the crossover point.

22. The method according to claim 19, wherein the two complementary differential output signals are on different voltage planes from each other.

23. The method according to claim 19, wherein the two complementary differential output signals comprise approximately equal rise and fall times.

24. The method according to claim 19, wherein the phase splitting step further comprises:
differentially splitting the input signal into a first set of opposite signals and into a second set of opposite signals.

25. The method according to claim 19, wherein the skew is more than 50 ps.

26. The method according to claim 19, wherein the amplifying step further comprises:
inverting of each of the two level shifted complementary output signals.

27. The method according to claim 19, wherein the step of amplifying further comprises:
providing a NMOS device having a first sized active area and a first gain;
providing a PMOS device having a second sized active area that is the same as the first sized active area and a second gain that is the same as the first gain, wherein shifts in crossover voltages for each of the two complementary differential output signals occur at approximately the same times for both of the complementary differential output signals because of the approximately equal first and second gains of the NMOS device and PMOS device.

28. The method according to claim 27, wherein the shifts in crossover voltages for each of the two complementary differential output signals occur at approximately the same times for both of the complementary differential output signals because of the approximately same size active areas for the NMOS device and PMOS device.

29. A non-transitory storage medium configured to store instruction data comprising:
  first instruction data for receiving of an input signal having rail to rail voltage transitions about a known voltage level from a second voltage level to a first voltage level;
  second instruction data for phase splitting the input signal into two complementary differential output signals that are spaced one from the other in potential and do not overlap;
  third instruction data for level shifting the two complementary differential output signals to form two level shifted complementary output signals that are other than rail to rail; and,
  fourth instruction data for amplifying the two level shifted complementary output signals.

* * * * *